United States Patent
Kodama et al.

(10) Patent No.: US 11,241,743 B2
(45) Date of Patent: Feb. 8, 2022

(54) COATED TOOL, CUTTING TOOL, AND METHOD FOR MANUFACTURING MACHINED PRODUCT

(71) Applicant: KYOCERA CORPORATION, Kyoto (JP)

(72) Inventors: Yoshikazu Kodama, Nobeoka (JP); Kenji Kumai, Satsumasendai (JP); Yuusaku Sugawa, Satsumasendai (JP)

(73) Assignee: KYOCERA Corporation, Kyoto (JP)

( * ) Notice: Subject to any disclaimer, the term of this patent is extended or adjusted under 35 U.S.C. 154(b) by 46 days.

(21) Appl. No.: 16/626,889

(22) PCT Filed: Jun. 20, 2018

(86) PCT No.: PCT/JP2018/023398
§ 371 (c)(1),
(2) Date: Dec. 27, 2019

(87) PCT Pub. No.: WO2019/004018
PCT Pub. Date: Jan. 3, 2019

(65) Prior Publication Data
US 2020/0122239 A1    Apr. 23, 2020

(30) Foreign Application Priority Data
Jun. 29, 2017  (JP) .............................. JP2017-127255

(51) Int. Cl.
*B23B 27/14* (2006.01)
*B23C 5/16* (2006.01)
*C23C 16/40* (2006.01)

(52) U.S. Cl.
CPC ............... *B23B 27/14* (2013.01); *B23C 5/16* (2013.01); *C23C 16/40* (2013.01)

(58) Field of Classification Search
CPC ....... B23B 27/14; B23B 27/148; C23C 16/40; C23C 16/403; B23C 5/16
USPC ........................... 51/307, 309; 428/701, 702
See application file for complete search history.

(56) References Cited

U.S. PATENT DOCUMENTS

| | | | |
|---|---|---|---|
| 2014/0193624 A1* | 7/2014 | Stiens | C23C 16/403 428/216 |
| 2014/0287210 A1* | 9/2014 | Tomita | C23C 16/403 428/216 |
| 2014/0377024 A1* | 12/2014 | Sobana | C23C 16/30 407/119 |
| 2016/0129507 A9 | 5/2016 | Deguchi | |
| 2016/0201192 A1* | 7/2016 | Tanibuchi | C23C 16/347 428/698 |

(Continued)

FOREIGN PATENT DOCUMENTS

| CN | 104797368 A | 7/2015 |
|---|---|---|
| CN | 105980090 A | 9/2016 |

(Continued)

*Primary Examiner* — Archene A Turner
(74) *Attorney, Agent, or Firm* — Viering Jentschura & Partner mbB

(57) ABSTRACT

A coated tool may include a base member having a first surface and a coating layer may be located on the first surface. The coating layer may include a first layer having a plurality of α-Al₂O₃ crystal particles. At least one of the α-Al₂O₃ crystal particles has at least two regions with different orientations from each other.

12 Claims, 9 Drawing Sheets

(56) References Cited

U.S. PATENT DOCUMENTS

| | | | |
|---|---|---|---|
| 2016/0326641 A1* | 11/2016 | Kodama | C23C 14/081 |
| 2016/0361767 A1 | 12/2016 | Ikeda | |
| 2017/0008092 A1* | 1/2017 | Ruppi | C30B 29/20 |
| 2017/0189968 A1 | 7/2017 | Paseuth et al. | |
| 2017/0190591 A1* | 7/2017 | Imamura | C01F 7/02 |
| 2017/0191169 A1* | 7/2017 | Imamura | C23C 16/56 |
| 2017/0259344 A1* | 9/2017 | Detani | B23B 27/148 |

FOREIGN PATENT DOCUMENTS

| | | | |
|---|---|---|---|
| JP | 2007-152491 | * | 6/2007 |
| JP | 2009-202264 | * | 9/2009 |
| JP | 2010-207953 | * | 9/2010 |
| JP | 2010207946 A | | 9/2010 |
| JP | 2011183487 A | | 9/2011 |
| JP | 2017042901 A | | 3/2017 |
| WO | 2017009928 A1 | | 1/2017 |

* cited by examiner

COATED TOOL, CUTTING TOOL, AND METHOD FOR MANUFACTURING MACHINED PRODUCT

CROSS-REFERENCE TO RELATED APPLICATIONS

The present application is a national stage entry according to 35 U.S.C. § 371 of PCT application No.: PCT/JP2018/023398 filed on Jun. 20, 2018; which claims priority to Japanese Patent Application Serial No.: 2017-127255, which was filed on Jun. 29, 2017; both of which are incorporated herein by reference in their entirety and for all purposes.

TECHNICAL FIELD

The present embodiment relates to a coated tool for use in a cutting process.

BACKGROUND

As a cutting tool for use when performing a cutting process of a workpiece, such as metal, for example, a surface coated cutting tool (hereinafter simply referred to as a coated tool) described, for example, in International Publication No. 2017/009928 (Patent Document 1) has been known. The coated tool described in Patent Document 1 includes a base material and a coating formed on the base material.

The coating includes a plurality of $\alpha$-$Al_2O_3$ crystal grains and exhibits a (001) orientation. The grain boundaries of the plurality of crystal grains include coincidence site lattice (CSL) grain boundaries and general grain boundaries. That is, the coating in the coated tool described in Patent Document 1 includes a plurality of crystal grains including different orientations from one another, and some of the grain boundaries of these crystal grains are CSL grain boundaries.

In the coated tool described in Patent Document 1, the coating includes a plurality of crystal grains including different orientations from one another. However, each crystal grain has one orientation. Therefore, when a cutting process is performed using the coated tool described in Patent Document 1, depending on the direction in which chips flow, some crystal grains are likely to be worn, and the wear resistance of the overall coating may be reduced. Nowadays, there is a need for a coated tool having a coating with improved wear resistance.

SUMMARY

A coated tool in one embodiment includes a base member including a first surface and a coating layer located on the first surface. The coating layer has a first layer including a plurality of $\alpha$-$Al_2O_3$ crystal particles. At least one of the $\alpha$-$Al_2O_3$ crystal particles is a differently oriented crystal particle including at least two differently oriented regions including different orientations.

BRIEF DESCRIPTION OF THE DRAWINGS

In the embodiments and figures, components which are the same or of the same type, or which have the same effect, are respectively provided with the same references. The elements represented and their size ratios with respect to one another are not to be regarded as to scale. Rather, individual elements, in particular layer thicknesses, may be represented exaggeratedly large for better understanding.

DETAILED DESCRIPTION

Figure 1:
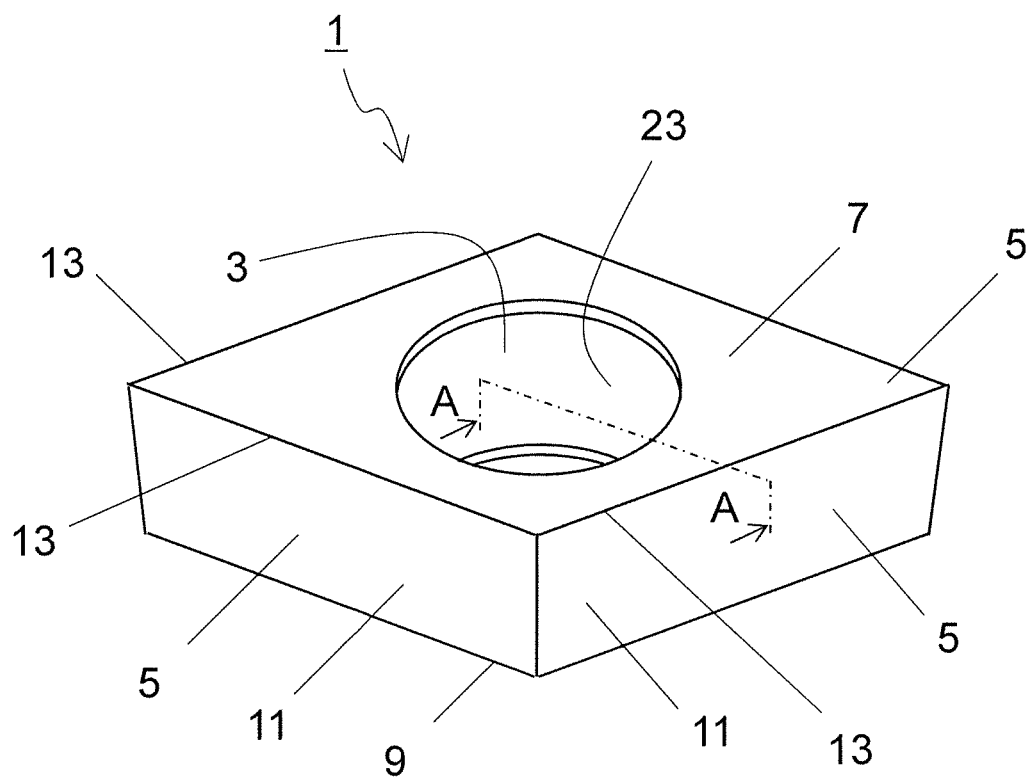
FIG. 1 is a perspective view illustrating a coated tool in an embodiment.

A coated tool 1 in the embodiment is described in detail below with reference to the drawings. For the sake of description, each of the drawings referred to in the following illustrates, in a simplified form, only main members necessary for describing the embodiment. Hence, the coated tool 1 is capable of including any structural member not illustrated in the drawings referred to. Sizes of the members in each of the drawings faithfully represent neither sizes of actual structural members nor size ratios of these members.

<Coated Tool>

Figure 2:
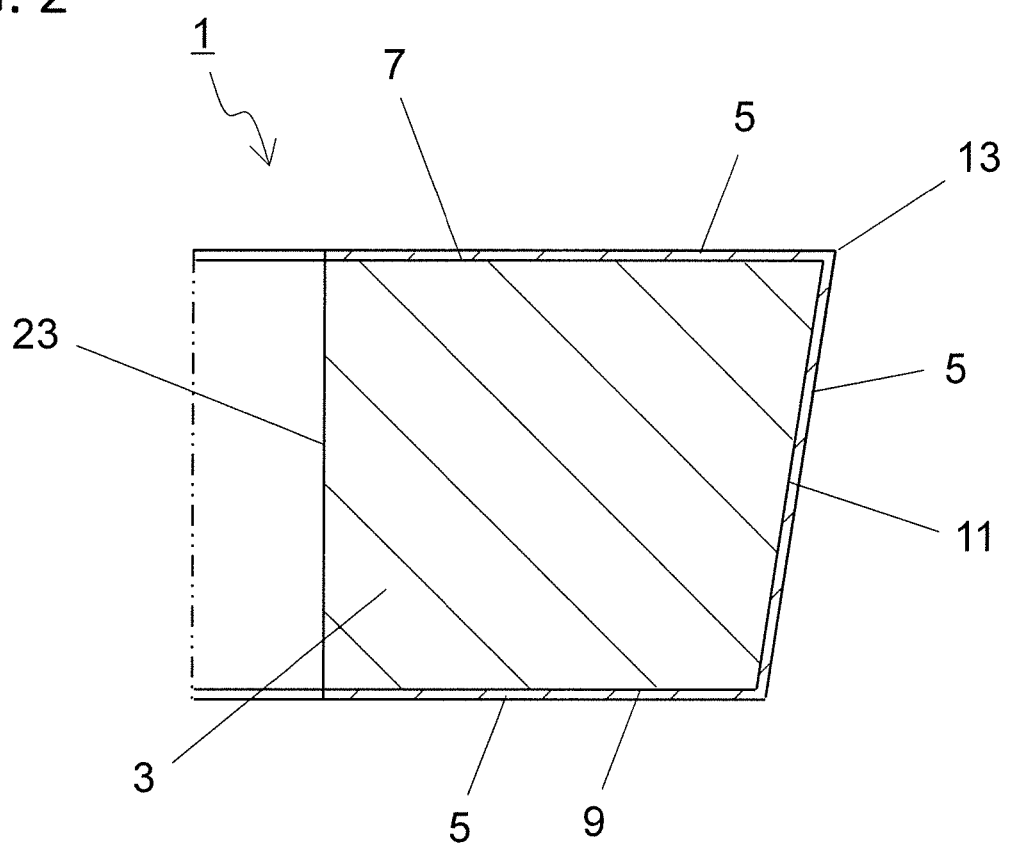
FIG. 2 is a sectional view taken along line A-A in the coated tool illustrated in FIG. 1.

The coated tool 1 of the embodiment includes a base member 3 and a coating layer 5 as illustrated in FIG. 1 and the like. The base member 3 includes a first surface 7 (upper surface in FIG. 2), a second surface 9 located on an opposite side of the first surface 7 (lower surface in FIG. 2), and a third surface 11 located between the first surface 7 and the second surface 9 (side surface in FIG. 2) in the example illustrated in FIG. 2.

The coating layer 5 is located at least on the first surface 7 of the base member 3. The coating layer 5 may be located only on the first surface 7, or may be located on a surface other than the first surface 7 in the base member 3. The coating layer 5 is also located on the third surface 11 in addition to the first surface 7 in the example illustrated in FIG. 2. The coating layer 5 is included for the purpose of improving characteristics of the coated tool 1 during a cutting process, such as wear resistance and chipping resistance.

A cutting edge 13 may be located at least on a part of a ridge line where surfaces corresponding to the first surface 7 and the third surface 11 of the base member 3 in the coated tool 1 intersect. When the coated tool 1 is used for performing a cutting process of a workpiece, the cutting process can be performed by bringing the cutting edge 13 into contact with the workpiece.

The base member 3 has a quadrangular plate shape, and the first surface 7 has a quadrangular shape in the example illustrated in FIG. 1. The second surface 9 is also a quadrangle. The number of the third surfaces 11 is therefore four. At least a part of the first surface 7 (for example, a range including a width of 2 mm from the ridge line where the first surface 7 and the third surface 11 intersect) is a rake surface region, and at least a part of the third surface 11 (for example, a range including a width of 2 mm from the ridgeline where the first surface 7 and the third surface 11 intersect) is a flank surface region in the example illustrated in FIG. 1. However, there is no problem even if at least a part of the first surface 7 is a flank surface region and at least a part of the third surface 11 is a rake surface region.

The shape of the base member 3 is not limited to the quadrangular plate shape. For example, the first surface 7 may have a triangular, pentagonal, hexagon, or circular shape. Alternatively, the base member 3 is not limited to have a columnar shape, and may have a plate shape.

Figure 4:
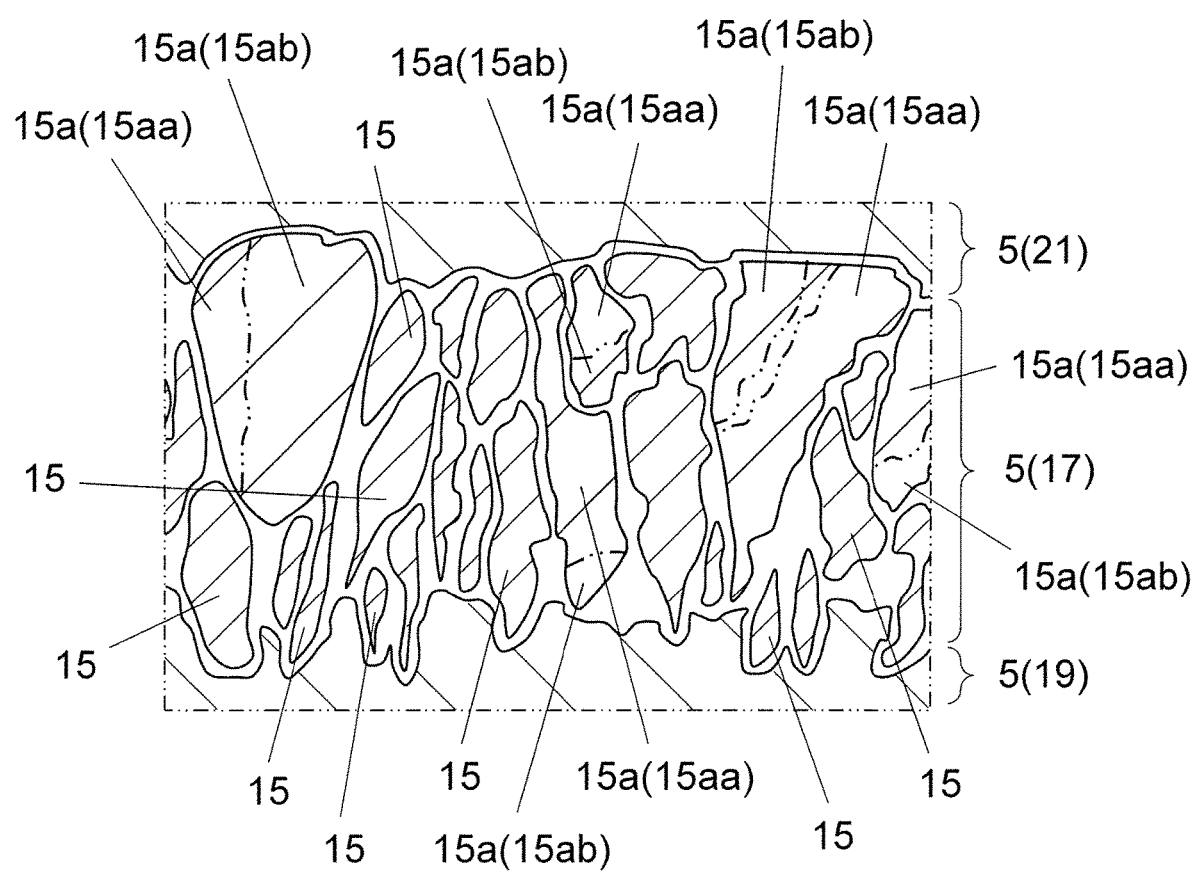
FIG. 4 is an enlarged view of a region B1 illustrated in FIG. 3.

The coating layer 5 includes a first layer 17 including a plurality of $\alpha$-$Al_2O_3$ ($\alpha$-alumina) crystal particles 15 in the example illustrated in FIG. 4. The first layer 17 includes $\alpha$-$Al_2O_3$ as a main component, but may include a component other than $\alpha$-$Al_2O_3$. For example, the first layer 17 may include a metal component, such as Ti, Si, Nb, Hf, V, Ta, Mo, Zr, Cr, and W.

Alumina such as $\gamma$-$Al_2O_3$ ($\gamma$-alumina) and $\kappa$-$Al_2O_3$ ($\kappa$-alumina) may be included. The term "main component" indicates a component having a largest value in mass % among values of other components.

Elemental analysis of the components included in the first layer 17 can be evaluated, for example, by an energy dispersive X-ray spectrometer (SEM-EDX) attached to a scanning electron microscope (SEM) or by a method using an electron probe microanalyzer (EPMA).

Identification of the alumina included in the first layer 17 from among $\alpha$-$Al_2O_3$, $\gamma$-$Al_2O_3$, and $\kappa$-$Al_2O_3$ can be evaluated, for example, by carrying out X-ray diffraction (XRD) analysis and by matching the JCPDS card.

At least one of the $\alpha$-$Al_2O_3$ crystal particles 15 in the example illustrated in FIG. 4 is a differently oriented crystal particle 15a including at least two differently oriented regions (hereinafter also simply referred to as regions) 15aa and 15ab including different orientations. That is, for example, when two of the $\alpha$-$Al_2O_3$ crystal particles 15 are defined as a first crystal particle and a second crystal particle, the orientation of the first crystal particle and the orientation of the second crystal particle are not simply different from each other.

In order to facilitate visual understanding, the differently oriented crystal particle 15a including at least the two regions 15aa and 15ab including different orientations among the plurality of $\alpha$-$Al_2O_3$ crystal particles 15 is illustrated in gray in FIG. 4.

When one differently oriented crystal particle 15a includes at least the two regions 15aa and 15ab including different orientations, the wear resistance of the coating layer 5 is high. The reason for this is as follows.

Since chips flow over the rake surface region during a cutting process of a workpiece, the chips come into contact with a part of the coating layer 5 corresponding to the rake surface region. Even if the orientations of the $\alpha$-$Al_2O_3$ crystal particles 15 are the same, there are a case in which the $\alpha$-$Al_2O_3$ crystal particles 15 are likely to be worn and a case in which the $\alpha$-$Al_2O_3$ crystal particles 15 are less likely to be worn, depending on the direction in which the chips flow.

When each of the $\alpha$-$Al_2O_3$ crystal particles 15 includes only one orientation, wear of some of the crystal particle 15 is likely to proceed, and there is a case in which wear of the coating layer 5 as a whole becomes likely to proceed with these crystal particles 15 as a starting point. However, since the two regions 15aa and 15ab include different orientations, even if one 15aa of the two regions is likely to be worn easily, the other 15ab of the two regions is less likely to be worn. Thus, wear resistance of the differently oriented crystal particle 15a as a whole is high.

Therefore, when at least one of the plurality of $\alpha$-$Al_2O_3$ crystal particles 15 is the differently oriented crystal particle 15a including at least the two regions 15aa and 15ab including different orientations, wear resistance of the coating layer 5 as a whole is high.

The first layer 17 may include at least one differently oriented crystal particle 15a. However, when the first layer 17 includes a plurality of differently oriented crystal particles 15a, the wear resistance of the first layer 17 is higher. There is no problem even if at least one of the differently oriented crystal particles 15a includes three or more regions. When one differently oriented crystal particle 15a includes three or more regions, the wear resistance of the differently oriented crystal particle 15a as a whole is even higher.

The orientation of the $\alpha$-$Al_2O_3$ crystal particles 15 may be evaluated by carrying out orientation analysis of the $\alpha$-$Al_2O_3$ crystal particles 15 using electron backscatter diffraction (EBSD). In an image obtained by EBSD, adjusting the coloring makes it possible to show the $\alpha$-$Al_2O_3$ crystal particles 15 in different colors according to the orientation, and to show the space between the adjacent crystal particles 15 in black, for example.

By adjusting the coloring as described above, it is possible to easily determine boundaries between the plurality of $\alpha$-$Al_2O_3$ crystal particles 15 included in the first layer 17. Since the color of the $\alpha$-$Al_2O_3$ crystal particles 15 displayed according to the orientation is different, it is possible to easily evaluate whether each of the $\alpha$-$Al_2O_3$ crystal particles 15 includes only one orientation or includes two or more regions including different orientations from one another.

The crystal particles 15 include $\alpha$-$Al_2O_3$ in the example illustrated in FIG. 4 as described above. The $\alpha$-$Al_2O_3$ includes a crystal structure of hexagonal crystal lattice, which is a hexagonal system. That is, in the $\alpha$-$Al_2O_3$ crystal particles 15, the $\alpha$-$Al_2O_3$ crystal has a generally hexagonal column shape. The surface corresponding to the end face of hexagon in the hexagonal column is a (001) surface in the $\alpha$-$Al_2O_3$ crystal. Therefore, the $\alpha$-$Al_2O_3$ crystal has a shape extending in a direction orthogonal to the (001) surface.

In the hexagonal $\alpha$-$Al_2O_3$ crystal particles 15, an angle formed by the normal direction of the (001) surface and the thickness direction of the first layer 17 is $\theta1$, an angle formed by the normal direction of a (210) surface and the thickness direction of the first layer 17 is $\theta2$, and an angle formed by the normal direction of a (120) surface and the thickness direction of the first layer 17 is $\theta3$. For example, when the normal direction of the (001) surface and the thickness direction of the first layer 17 are the same, ($\theta1$, $\theta2$, $\theta3$)=(0°, 90°, 90°) is true.

The values of ($\theta1$, $\theta2$, $\theta3$) can be evaluated by orientation analysis of the $\alpha$-$Al_2O_3$ crystal particles 15 in an image obtained using electron backscatter diffraction. The values of ($\theta1$, $\theta2$, $\theta3$) may be calculated by comparing the components in the normal direction of each of the (001) surface, the (210) surface, and the (120) surface, for example.

When the orientations of the two regions 15aa and 15ab are different from each other, the values of ($\theta1$, $\theta2$, $\theta3$) in one 15aa of the two regions is different from the values of ($\theta1$, $\theta2$, $\theta3$) in the other 15ab of the two regions.

The values of ($\theta1$, $\theta2$, $\theta3$) in each of the two regions 15aa and 15ab are not limited to specific values. For example, $\theta1$ may be smaller than $\theta2$ and $\theta3$ in each of the two regions 15aa and 15ab.

When θ1 is smaller than θ2 and θ3 in each of the two regions 15aa and 15ab, the α-Al$_2$O$_3$ crystal is likely to have a shape relatively extending in the thickness direction of the first layer 17. Therefore, each of the two regions 15aa and 15ab has high wear resistance. The orientations of the two regions 15aa and 15ab when θ1 is smaller than θ2 and θ3 are indicated by, for example, (001), (104), (105), or (θ18). However, it is needless to say that the orientations of the two regions 15aa and 15ab are not limited thereto.

In at least one of the differently oriented crystal particles 15a shown in a cross section orthogonal to the first surface 7, the boundary between the regions 15aa and 15ab may extend along the thickness direction of the first layer 17. In the example illustrated in FIG. 4, the boundaries between the regions 15aa and 15ab are indicated by two-dot chain lines.

When the above boundary extends along the thickness direction of the first layer 17, both of the two regions 15aa and 15ab are likely to come into contact with the workpiece when the differently oriented crystal particles 15a come into contact with the workpiece during a cutting process. Due to this, the differently oriented crystal particles 15a are less likely to be worn, and hence the wear resistance of the coating layer 5 as a whole is high.

The phrase "the boundary between the regions 15aa and 15ab extends along the thickness direction of the first layer 17" means that the angle formed by an imaginary straight line connecting an end on the base member 3 side and an end on the surface side in the above regions with respect to the thickness direction of the first layer 17 is equal to or less than 30°.

In at least one of the differently oriented crystal particles 15a including two or more regions 15aa and 15ab, the boundary may extend over a part of the differently oriented crystal particles 15a on the side away from the base member 3. In this case, the wear resistance of the first layer 17 is even higher. This is because in the above case, both of the two regions 15aa and 15ab are likely to come into contact with the workpiece when the differently oriented crystal particles 15a come into contact with the workpiece during a cutting process.

The phrase "the part of the differently oriented crystal particles 15a on the side away from the base member 3" means a part located on a side farther away from the base member 3 than the center of the differently oriented crystal particle 15a in the direction along the thickness direction.

The boundary between the regions 15aa and 15ab may extend over a part on a side farthest away from the base member 3 among the differently oriented crystal particles 15a divided into four equal parts along the thickness direction. In this case, both of the two regions 15aa and 15ab are more likely to come into contact with the workpiece when the differently oriented crystal particles 15a come into contact with the workpiece during a cutting process.

The first layer 17 illustrated in FIG. 4 includes a surface 17A facing the base member 3 and a surface 17B located on an opposite side of the surface 17A. At least one of the differently oriented crystal particles 15a may be located from the surface 17A to the surface 17B. When the differently oriented crystal particles 15a are located as described above, the durability of the first layer 17 is high in a wide range in the thickness direction. Therefore, the wear resistance of the first layer 17 is high even when a cutting process is performed over a long period of time.

The first layer 17 illustrated in FIG. 4 includes the plurality of differently oriented crystal particles 15a. The first layer 17 may include a part where at least two of the plurality of differently oriented crystal particles 15a are adjacent to each other. When at least two of the differently oriented crystal particles 15a having excellent wear resistance are adjacent to each other, the wear resistance of the first layer 17 is more excellent.

Specifically, for example, at least two of the plurality of differently oriented crystal particles 15a may be adjacent to each other along the thickness direction of the first layer 17. Even when the differently oriented crystal particle 15a on the side located away from the base member 3 in the thickness direction of the first layer 17 of the two differently oriented crystal particles 15a described above has been worn due to a long-time cutting process, the wear resistance of the first layer 17 is maintained high by the differently oriented crystal particle 15a on the side located close to the base member 3 in the thickness direction of the first layer 17 of the two differently oriented crystal particles 15a described above. Therefore, the durability of the first layer 17 is high even for a long-time cutting process.

For example, at least two of the plurality of differently oriented crystal particles 15a may be adjacent to each other along the direction orthogonal to the thickness direction of the first layer 17. In this case, both of these two differently oriented crystal particles 15a are likely to come into contact with the workpiece simultaneously during the cutting process. Therefore, the durability of the first layer 17 when these two differently oriented crystal particles 15a are in contact with the workpiece is high.

In the cross section orthogonal to the first surface 7, among the plurality of α-Al$_2$O$_3$ crystal particles 15, a mean particle diameter of the differently oriented crystal particles 15a including the regions 15aa and 15ab may be greater than a mean particle diameter of the crystal particles 15 other than the differently oriented crystal particles 15a. Also in this case, the wear resistance of the first layer 17 is high. This is because in the differently oriented crystal particle 15a including a region, the volume occupied by each region is likely to be small compared with the crystal particle 15 including only one orientation other than the differently oriented crystal particles 15a, but it is easy to ensure volume occupied by each region in the above case.

Among the plurality of α-Al$_2$O$_3$ crystal particles 15, a mean width in the direction orthogonal to the thickness direction of the first layer 17 in the differently oriented crystal particles 15a including the two regions 15aa and 15ab as regions may be larger than a mean width in the direction orthogonal to the thickness direction of the first layer 17 in the crystal particles 15 other than the differently oriented crystal particles 15a. In this case, the wear resistance of the first layer 17 is high.

In the cross section orthogonal to the first surface 7, a boundary between the two regions 15aa and 15ab in one of the plurality of differently oriented crystal particles 15a may be a Σ3-type crystal grain boundary. In this case, the joinabilitiy between the two regions 15aa and 15ab is high. Therefore, the strength of this differently oriented crystal particle 15a is high.

The phrase "the boundary between the two regions 15aa and 15ab is a Σ3-type crystal grain boundary" means that "the entire boundary is not limited to the Σ3-type crystal grain boundary. This boundary may partially include a Σ7-type crystal grain boundary, a Σ11-type crystal grain boundary, a Σ17-type crystal grain boundary, a Σ19-type crystal grain boundary, a Σ21-type crystal grain boundary, a Σ23-type crystal grain boundary, or a Σ29-type crystal grain boundary, for example. However, even when the boundary partially includes these crystal grain boundaries, the length of the Σ3-type crystal grain boundary is longer than the sum of the lengths of these crystal grain boundaries, in the cross section orthogonal to the first surface 7".

The coating layer 5 may be configured to include only the first layer 17, or may include another layer in addition to the first layer 17. The coating layer 5 may include, in addition to the first layer 17, a second layer 19 located between the first layer 17 and the base member 3 and a third layer 21 located on the first layer 17, as illustrated in FIG. 3, for example.

Figure 3:
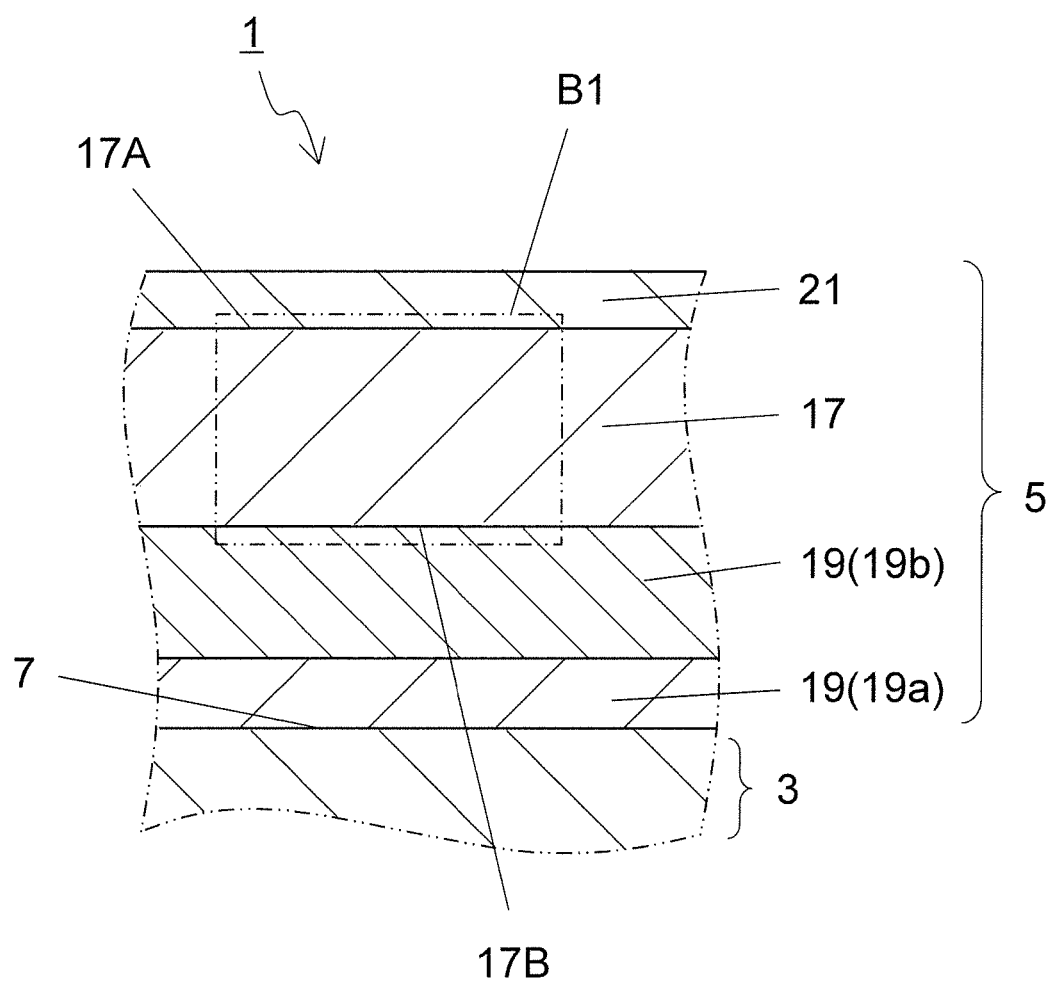
FIG. 3 is an enlarged view in the vicinity of a coating layer in the coated tool illustrated in FIG. 2.

The second layer 19 is located between the first layer 17 and the base member 3, is in contact with the first layer 17 and the base member 3, and includes a titanium compound in the example illustrated in FIG. 3. Examples of the titanium compound included in the second layer 19 include titanium carbide, nitride, oxide, carbonitride, carbon oxide, and oxycarbonitride. The second layer 19 may be configured to include only one of the above compounds or, alternatively, may be configured to include a plurality of kinds of the above compounds.

The second layer 19 may be made into a single layer or, alternatively, may include a configuration in which a plurality of layers are laminated one another. For example, the second layer 19 may include a configuration in which a layer 19a located on the base member 3 side and including titanium nitride (TiN) and a layer 19b located on the first layer 17 side and including titanium carbonitride (TiCN) are sequentially located.

In a case where the second layer 19 includes the layer including titanium nitride, the joinabilitiy between the base member 3 and the coating layer 5 is enhanced. In a case where the second layer 19 includes the layer including titanium carbonitride, the joinabilitiy between the first layer 17 and the second layer 19 is high.

The third layer 21 is contactedly located on the first layer 17 and includes a titanium compound in the example illustrated in FIG. 3. Examples of the titanium compound included in the third layer 21 include titanium carbide, nitride, oxide, carbonitride, carbon oxide, and oxycarbonitride, as in the second layer 19.

Elemental analysis of the components included in each of the second layer 19 and the third layer 21 can be evaluated, for example, by an SEM-EDX or by a method using an EPMA, similar to the elemental analysis in the first layer 17.

In the coated tool 1 of this embodiment, since at least one of the plurality of $\alpha$-$Al_2O_3$ crystal particles 15 is a differently oriented crystal particle 15a including at least the two regions 15aa and 15ab including different orientations, wear of the first layer 17 in the differently oriented crystal particle 15a including the two regions 15aa and 15ab is less likely to proceed even in a case where the third layer 21 is worn and the first layer 17 is exposed.

The second layer 19 and the third layer 21 may include a component other than the titanium compound. For example, when the second layer 19 and the third layer 21 include alumina, the joinabilitiy among the first layer 17, the second layer 19, and the third layer 21 is high. Since the second layer 19 and the third layer 21 include a titanium compound, the joinabilitiy among the first layer 17, the second layer 19, and the third layer 21 is high even in a case where the first layer 17 includes titanium.

Examples of material of the base member 3 include inorganic materials, such as cemented carbide, cermet and ceramics. The material of the base member 3 is not limited to these materials.

Examples of composition of the cemented carbide include WC (tungsten carbide)-Co (cobalt), WC—TiC (titanium carbide)-Co, and WC—TiC—TaC (tantalum carbide)-Co.

Specifically, WC, TiC and TaC are hard particles, and Co is a binding phase. The cermet is a sintered composite material obtainable by compositing metal into a ceramic component. Specific examples of the cermet include compounds composed mainly of TiCN, TiC, or TiN.

The base member 3 may include a through hole 23 that passes through the first surface 7 and the second surface 9. The through hole 23 is usable for receiving a fixing member that is intended to fix the coated tool 1 to a holder. Examples of the fixing member include a screw and a clamping member.

The size of the base member 3 is not particularly limited. For example, a length of one side of the first surface 7 may be set to approximately 3-20 mm. A height from the first surface 7 to the second surface 9 may be set to approximately 2-20 mm.

<Manufacturing Method>

A method for manufacturing the coated tool 1 in the embodiment is described below.

Firstly, a mixed powder is manufactured by suitably adding metal powder, carbon powder or the like to inorganic powder selected from carbide, nitride, carbonitride and oxide or the like, which are capable of forming a hard alloy constituting the base member 3 by sintering, and then by mixing them together.

Subsequently, a molded body is manufactured by molding the mixed powder into a predetermined tool shape with the use of a known molding method. Examples of the molding method include press molding, casting molding, extrusion molding and cold isostatic pressing. The base member 3 is manufactured by sintering the molded body in vacuum or a non-oxidizing atmosphere. A surface of the base member 3 may be then subjected to polishing process and honing process as needed.

Subsequently, the coating layer 5 is deposited on the surface of the base member 3 by chemical vapor deposition (CVD) method.

The first layer 17 can be formed by the following method. A first mixed gas is manufactured by blending 5-15 vol % of aluminum trichloride ($AlCl_3$) gas, 0.5-2.5 vol % of hydrogen chloride (HCl) gas, 0.5-10 vol % of carbon dioxide ($CO_2$) gas, and equal to or less than 1 vol % of hydrogen sulfide ($H_2S$) gas into hydrogen gas ($H_2$). This first mixed gas is introduced into the chamber under conditions of a deposition temperature of 950-1100° C. and a gas pressure of 5-20 kPa. In this manner, the first layer 17 in the coating layer 5 can be formed.

Not by forming the first layer 17 in a state where the ratio of carbon dioxide gas in the first mixed gas is constant but by changing the ratio of carbon dioxide gas in a middle of forming the first layer 17, it is possible to form the differently oriented crystal particle 15a including at least two regions 15aa and 15ab including different orientations.

It is possible to form the differently oriented crystal particle 15a including the two regions 15aa and 15ab including different orientations to each other by reducing the ratio of carbon dioxide gas in a middle of forming the first layer 17 so that the ratio of carbon dioxide gas is higher than that of aluminum trichloride gas at the initial stage of forming the first layer 17 and the ratio of aluminum trichloride gas is higher than that of carbon dioxide gas at the later stage of forming the first layer 17.

When the coating layer 5 includes the second layer 19 located between the base member 3 and the first layer 17, the second layer 19 can be formed by the following method.

First, a second mixed gas is manufactured by blending 0.5-10 vol % of titanium tetrachloride gas and 10-60 vol % of nitrogen gas into hydrogen gas. This second mixed gas is introduced into the chamber under conditions of a deposition temperature of 800-940° C. and a gas pressure of 8-50 kPa. In this manner, the layer 19a including titanium nitride in the second layer 19 can be formed.

A third mixed gas is manufactured by blending 0.5-10 vol % of titanium tetrachloride gas, 5-60 vol % of nitrogen gas, and 0.1-3 vol % of acetonitrile ($CH_3CN$) gas into hydrogen gas. This third mixed gas is introduced into the chamber under conditions of a deposition temperature of 780-880° C. and a gas pressure of 5-25 kPa. In this manner, the layer 19b including titanium carbonitride in the second layer 19 can be formed.

When the coating layer 5 includes the third layer 21 located on the first layer 17, the third layer 21 can be formed by the following method. A fourth mixed gas is manufactured by blending 0.1-10 vol % of titanium tetrachloride ($TiCl_4$) gas and 10-60 vol % of nitrogen ($N_2$) gas into hydrogen gas. This fourth mixed gas is introduced into the chamber under conditions of a deposition temperature of 960-1100° C. and a gas pressure of 10-85 kPa. In this manner, the third layer 21 in the coating layer 5 can be formed.

Thereafter, as needed, a polishing process is carried out on a part of the surface of the deposited coating layer 5 at which the cutting edge 13 is located. If the polishing process is carried out, a workpiece is less likely to be welded onto the cutting edge 13, thus leading to the coated tool 1 having excellent fracture resistance.

The above manufacturing method is one example of the method for manufacturing the coated tool 1 of the present embodiment. Hence, the coated tools 1 are not limited to ones which are manufactured by the above manufacturing method.

<Cutting Tool>

A cutting tool 101 of the embodiment is described below with reference to the drawings.

Figure 5:
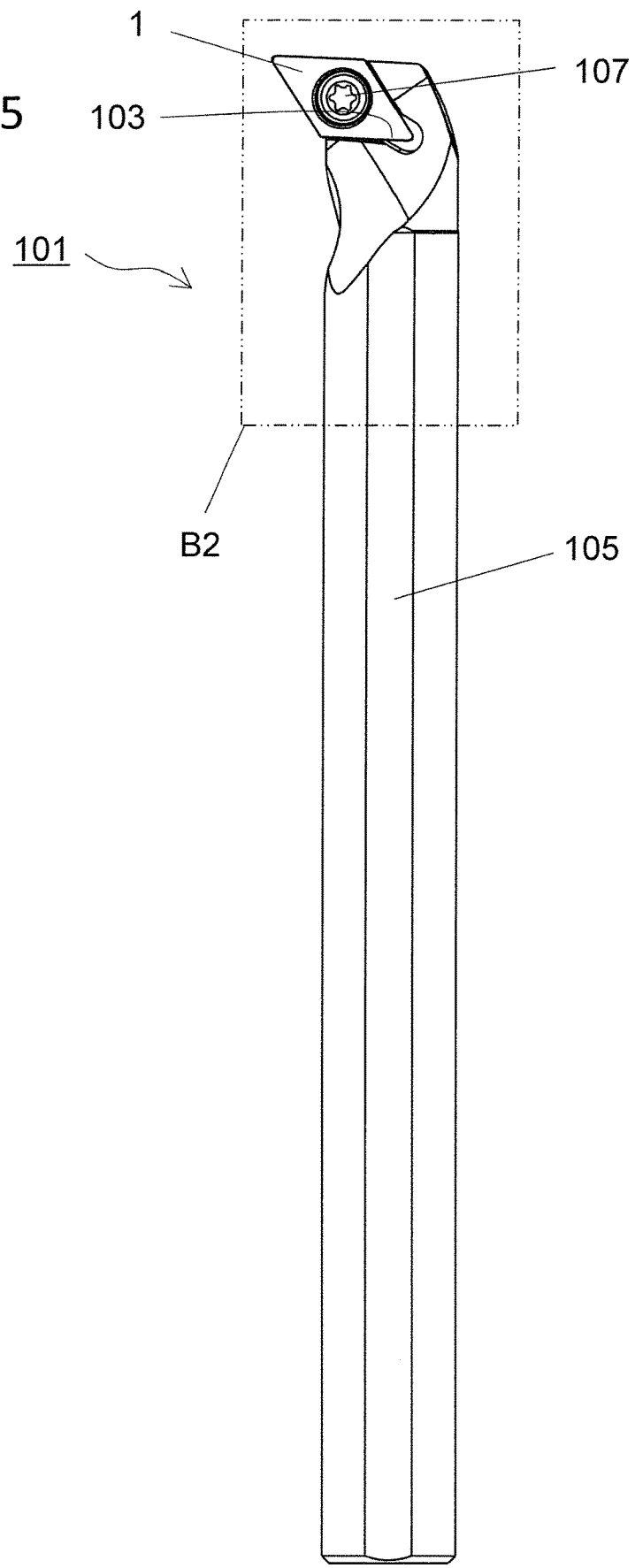
FIG. 5 is a plan view illustrating a cutting tool in the embodiment.
Figure 6:
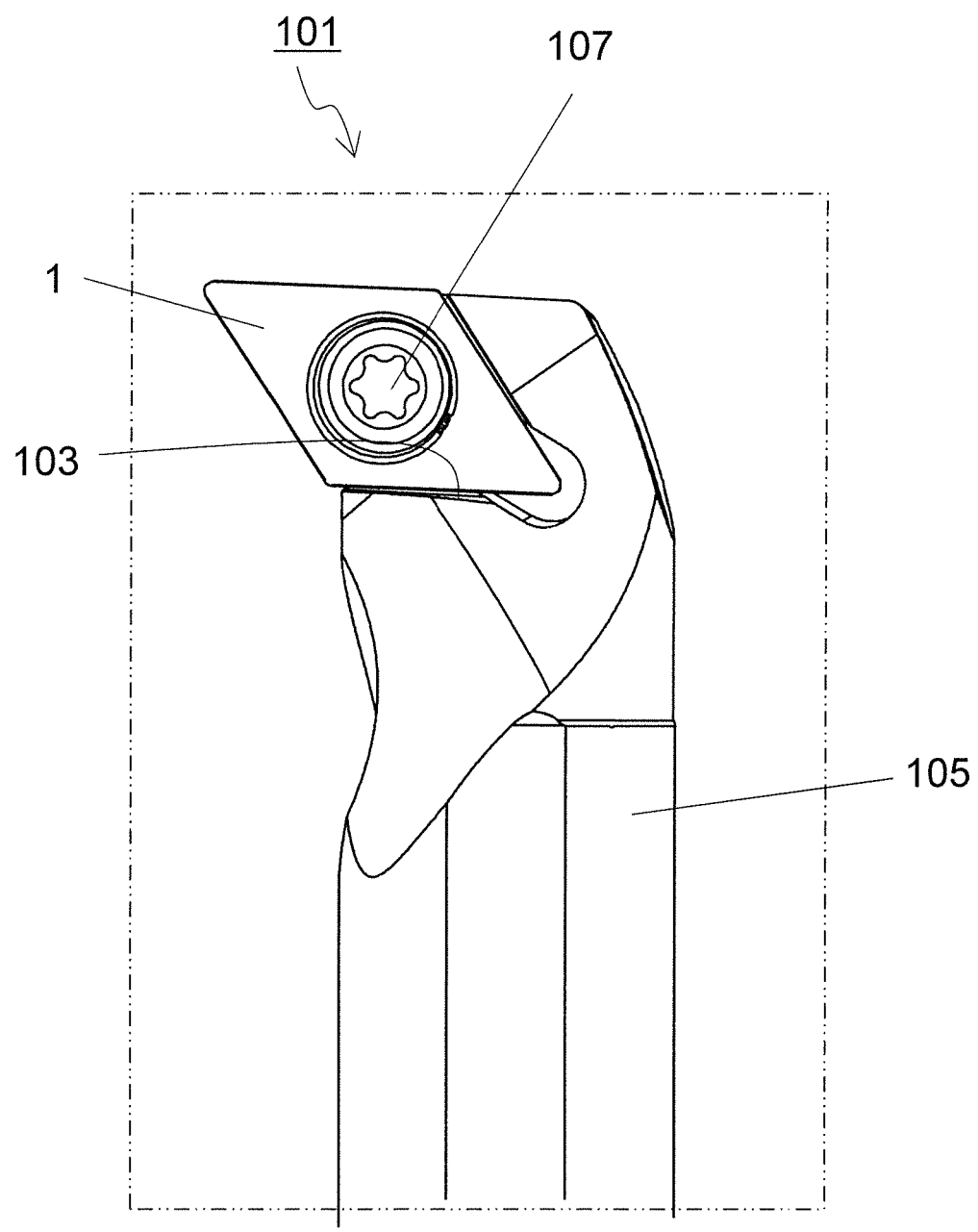
FIG. 6 is an enlarged view of a region B2 illustrated in FIG. 5.

As illustrated in FIGS. 5 and 6, the cutting tool 101 of the embodiment includes a bar-shaped body that extends from a first end (an upper end in FIG. 5) to a second end (a lower end in FIG. 5). The cutting tool 101 includes a holder 105 with a pocket 103 at a side of the first end, and the coated tool 1 located at the pocket 103. In the cutting tool 101 of the embodiments, the coated tool 1 is attached so that a part of the ridge line which is usable as a cutting edge is protruded from a front end of the holder 105 in the cutting tool 101 of the embodiment.

The pocket 103 is a part that permits attachment of the coated tool 1. The pocket 103 includes a seating surface parallel to a lower surface of the holder 105, and a constraining side surface inclined relative to the seating surface. The pocket 103 opens into a side of the first end of the holder 105.

The coated tool 1 is located in the pocket 103. A surface on the opposite side of the first surface in the coated tool 1 may be in a direct contact with the pocket 103. Alternatively, a sheet may be held between the coated tool 1 and the pocket 103.

The coated tool 1 is attached so that the part of the ridge line which is usable as the cutting edge is protruded outward from the holder 105. The coated tool 1 is attached to the holder 105 by a screw 107 in the embodiment. Specifically, the coated tool 1 is attached to the holder 105 in such a manner that screw parts are engaged with each other by inserting the screw 107 into the through hole of the coated tool 1, and by inserting a front end of the screw 107 into a screw hole (not illustrated) formed in the pocket 103.

For example, steel and cast iron are usable as the holder 105. Of these materials, high toughness steel may be used.

The embodiment has illustrated and described the cutting tools for use in the so-called turning process. Examples of the turning process include inner diameter processing, outer diameter processing and grooving process. The cutting tools are not limited to ones which are used for the turning process. For example, the coated tools 1 of the above embodiment are applicable to the cutting tools for use in the milling process.

<Method for Manufacturing Machined Product>

A method for manufacturing a machined product in a non-limiting embodiment is described below with reference to the drawings.

The machined product is manufacturable by carrying out a cutting process of a workpiece 201. The method for manufacturing a machined product in the present embodiments includes the following steps: (1) rotating the workpiece 201;

(2) bringing the cutting tool 101 represented by the above embodiment into contact with the workpiece 201 being rotated; and (3) moving the cutting tool 101 away from the workpiece 201.

Figure 7:
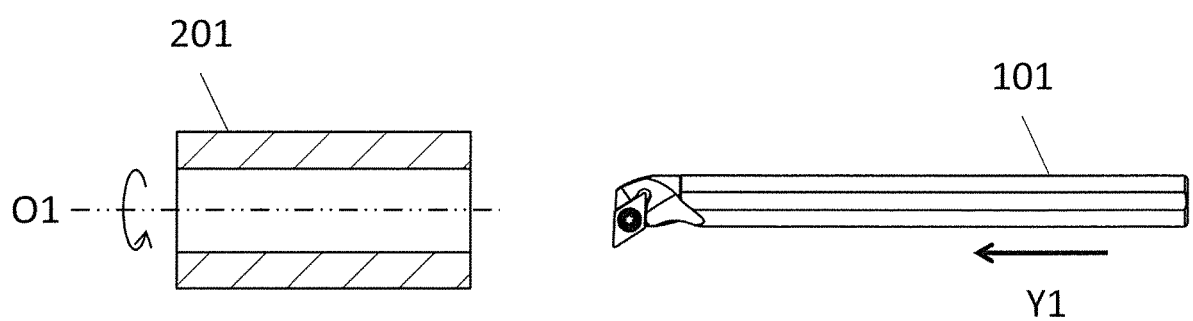
FIG. 7 is a schematic diagram illustrating a step in a method for manufacturing a machined product in the embodiment.
Figure 8:
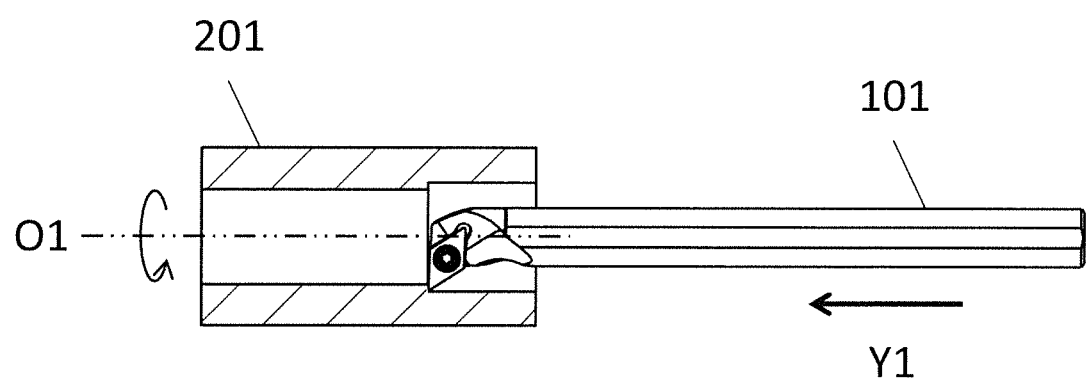
FIG. 8 is a schematic diagram illustrating a step in a method for manufacturing a machined product in the embodiment.
Figure 9:
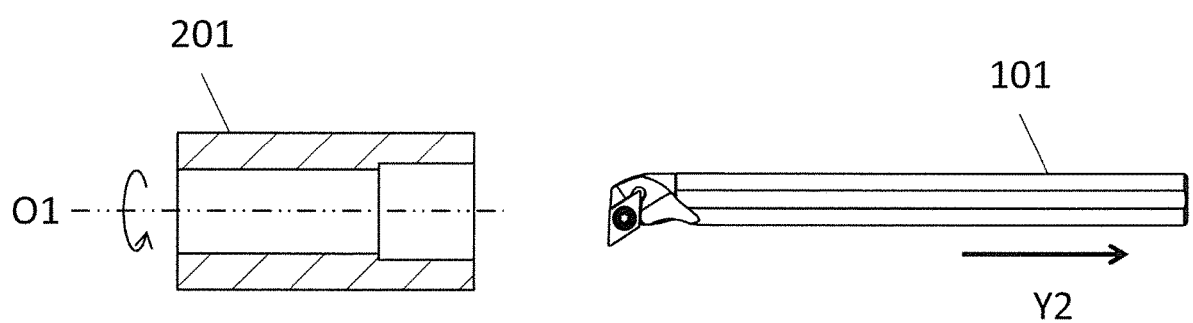
FIG. 9 is a schematic diagram illustrating a step in a method for manufacturing a machined product in the embodiment.

More specifically, firstly, the workpiece 201 is rotated around an axis O1, and the cutting tool 101 is relatively brought near the workpiece 201 as illustrated in FIG. 7. Then, the workpiece 201 is cut out by bringing the cutting edge in the cutting tool 101 into contact with the workpiece 201 as illustrated in FIG. 8. Thereafter, the cutting tool 101 is relatively moved away from the workpiece 201 as illustrated in FIG. 9.

In the embodiment, the cutting tool 101 is brought near the workpiece 201 by fixing the axis O1, and by moving the cutting tool 101 in Y1 direction in a state in which the workpiece 201 is rotated around the axis O1. In FIG. 8, the workpiece 201 is cut out by bringing the cutting edge in an insert 1 into contact with the workpiece 201 being rotated. In FIG. 9, the cutting tool 101 is moved away by being moved in Y2 direction in a state in which the workpiece 201 is rotated.

During the cutting process with the manufacturing method of the embodiment, the cutting tool 101 is brought into contact with the workpiece 201, or the cutting tool 101 is moved away from the workpiece 201 by moving the cutting tool 101 in each of the steps. However, there is no intention to limit to the above embodiment.

For example, the workpiece 201 may be brought near the cutting tool 101 in the step (1). Similarly, the workpiece 201 may be moved away from the cutting tool 101 in the step (3). When the cutting process is continued, it is necessary to repeat the step of bringing the cutting edge in the insert 1 into contact with different portions of the workpiece 201, while keeping the workpiece 201 rotated.

Representative examples of material of the workpiece 201 include carbon steel, alloy steel, stainless steel, cast iron, and nonferrous metals.

DESCRIPTION OF THE REFERENCE NUMERAL

1: Coated tool
3: Base member
5: Coating layer
7: First surface
9: Second surface
11: Third surface 13: Cutting edge
15: Crystal particle
15a: Differently oriented crystal particle
17: First layer
19: Second layer
21: Third layer
23: Through hole
101: Cutting tool
103: Pocket
105: Holder
107: Screw
201: Workpiece

What is claimed is:

1. A coated tool, comprising:
   a base member comprising a first surface; and
   a coating layer located on the first surface;
   wherein
   the coating layer comprises:
      a first layer comprising a plurality of $\alpha$-$Al_2O_3$ crystal particles, and
      a second layer comprising a titanium compound, the second layer in contact with the first layer and located between the first layer and the base member; and
   at least one of the $\alpha$-$Al_2O_3$ crystal particles comprises at least two regions with different orientations from each other.

2. The coated tool according to claim 1, wherein the at least one of the $\alpha$-$Al_2O_3$ crystal particles comprises three or more regions with different oriented regions from each other.

3. The coated tool according to claim 1, wherein a boundary between the different oriented regions of the at least one of the $\alpha$-$Al_2O_3$ crystal particles extends along a thickness direction of the first layer.

4. The coated tool according to claim 3, wherein the first layer comprises:
   a surface A facing the base member; and
   a surface B located on an opposite side of the surface A; and
   at least one of the $\alpha$-$Al_2O_3$ crystal particles comprising at least two regions with different orientations is located from the surface A to the surface B.

5. The coated tool according to claim 1, wherein the first layer comprises a part where a plurality of $\alpha$-$Al_2O_3$ crystal particles comprising at least two regions with different orientations are adjacent to each other.

6. The coated tool according to claim 5, wherein the plurality of $\alpha$-$Al_2O_3$ crystal particles comprising at least two regions with different orientations are adjacent to each other along a thickness direction of the first layer.

7. The coated tool according to claim 5, wherein the plurality of $\alpha$-$Al_2O_3$ crystal particles comprising at least two regions with different orientations are adjacent to each other along a direction orthogonal to a thickness direction of the first layer.

8. The coated tool according to claim 1, wherein a mean particle diameter of the at least one of the $\alpha$-$Al_2O_3$ crystal particles comprising at least two regions with different orientations is larger than a mean particle diameter of a set of crystal particles other than the at least one $\alpha$-$Al_2O_3$ crystal particles comprising at least two regions with different orientations.

9. The coated tool according to claim 1, wherein a boundary between the at least two regions with different orientations is a $\Sigma 3$-type crystal grain boundary.

10. A cutting tool, comprising:
    a holder comprising a pocket located at a front end side; and
    the coated tool according to claim 1, which is located at the pocket.

11. A method for manufacturing a machined product, comprising:
    rotating the cutting tool according to claim 10;
    bringing the cutting tool being rotated into contact with a workpiece; and
    moving the cutting tool away from the workpiece.

12. The coated tool according to claim 6, wherein the plurality of $Al_2O_3$ crystal particles comprising at least two regions with different orientations are adjacent to each other along a direction orthogonal to a thickness direction of the first layer.

* * * * *